United States Patent
Hamm et al.

[19]

[11] Patent Number: 6,156,665
[45] Date of Patent: Dec. 5, 2000

[54] TRILAYER LIFT-OFF PROCESS FOR SEMICONDUCTOR DEVICE METALLIZATION

[75] Inventors: Robert Alan Hamm, Staten Island, N.Y.; Rose Fasano Kopf, Green Brook; Robert William Ryan, Piscataway, both of N.J.

[73] Assignee: Lucent Technologies Inc., Murray Hill, N.J.

[21] Appl. No.: 09/059,359

[22] Filed: Apr. 13, 1998

[51] Int. Cl.[7] .................................................. H01L 21/302
[52] U.S. Cl. ........................ 438/706; 438/708; 438/717; 438/723; 438/725
[58] Field of Search ............................... 216/40; 438/725, 438/717, 706, 712, 723, 745, 708, 736

[56] References Cited

U.S. PATENT DOCUMENTS

| | | | |
|---|---|---|---|
| 5,258,264 | 11/1993 | Mathad et al. | 430/315 |
| 5,277,749 | 1/1994 | Griffith et al. | 216/40 |
| 5,344,517 | 9/1994 | Houlding | 156/236 |
| 5,360,697 | 11/1994 | Mehra | 430/314 |
| 5,512,518 | 4/1996 | Cho et al. | 438/184 |
| 5,541,128 | 7/1996 | Kwasnick et al. | 438/160 |

*Primary Examiner*—Benjamin Utech
*Assistant Examiner*—Binh X. Tran
*Attorney, Agent, or Firm*—Thomas, Kayden, Horstemeyer & Risley LLP

[57] ABSTRACT

The specification describes a trilevel resist technique for defining metallization patterns by lift-off. The trilevel resist comprises two standard photoresist levels separated by a thin silicon oxide layer with approximate composition $SiO_2$.

13 Claims, 5 Drawing Sheets

TRILAYER LIFT-OFF PROCESS FOR SEMICONDUCTOR DEVICE METALLIZATION

FIELD OF THE INVENTION

This invention relates to lithographic methods for defining metallization patterns using lift-off techniques.

BACKGROUND OF THE INVENTION

Lift-off processes are well known in semiconductor device manufacturing. They were used early in silicon LSI processing until etch processes became the techniques of choice for VLSI technology. Etch processes can provide high definition patterns if the etch selectivity between the material being etched and other exposed materials is high. Etch techniques have been developed in silicon technology that provide good etch selectivity for the material systems of interest, but acceptable etch selectivity in III–V processing has been difficult to obtain. Accordingly, lift-off patterning techniques are used in critical patterning steps in the manufacture of many III–V devices.

In III–V device technology, the surface topography is typically severe. Vertical steps may be comparable in dimension to the spacing between features being defined. This is partly attributable to the fact that bipolar transistors are prominently used in III–V integrated circuits, and bipolar devices typically have mesa structures. Due to this factor multi-level resists, with at least one planarizing level, are typically used for lift-off in III–V IC processing.

Because surface topography in III–V device technology is so severe, edge definition becomes a critical issue. If the aspect ratio (height to width) of features being defined is large, variations in edge definition, which can be comparable in size to the feature thickness, may span the spacing between features. If that occurs, shorts result.

Much effort has gone into development of bilayer and trilayer resist schemes to overcome these problems. Bilayer processes involve a dual resist scheme, with a thick underlying resist for planarizing the structure, followed by another type of resist or contrast enhancement layer. The upper resist layer typically forms an overhang on top which is a common feature of multilayer resist processes. The overhang creates a positive discontinuity between regions of the deposited metallization layer as it steps from one level to another. The discontinuity insures lift-off of the metal deposited on the upper level of the multilevel resist.

Two layer resist schemes have drawbacks, often caused by mixing of the resist materials, thereby impairing edge definition and making it difficult to obtain a uniform overhang over large areas. See S. Zhang, et al, $4^{th}$ International Conference on Solid-state and Integrated Circuit Technology, Proceedings (Cat. No. 95TH8143), G L Baldwin, Z Li, C C Tsai, and J. Zhang, ed. New York, N.Y. IEEE p. 41–43 (1995). In addition, some two layer processes use chlorobenzene, a hazardous and environmentally undesirable material. See R. Williams, Gallium Arsenide Processing Techniques (Artech House, Dedham, Mass., 1984), and P Kalee Prasad and J Narain, "Improved Lift-off Techniques for Thick Aluminum Metallization", *Semiconductor Devices* (Proc. SPIE Vol. 2733), K Lai, ed (Narosa Publishing House, New Delhi, India) 499 (1995).

Three layer resist processes avoid the resist mixing problem by using an intermediate transfer layer to segregate the resist layers. See for example, "Lift-Off Process for Achieving Fine-Line Mettalization", A A Milgram, *J. Vac. Sci. Technol.* B1 (2), 490 (1983); "Trilayer Lift-Off Metallization Process Using Low Temperature Deposited $SiN_x$", J R Lothian, F Ren, S J Pearton, U K Chakrabarti, C R Abernathy and A Katz, J. Vac. Sci. Technol. B10 (6), 2361 (1992); S P Lyman, J L Jackel and P L Liu, "Lift-off of Thick Metal Layers Using Multilayer Resist", J. Vac. Sci. Technol. 19 (4), 1325 (1981). But trilayer resist processes also have drawbacks. Some of the techniques described in the references cited above use a Ge transfer layer. Ge transfer layers obscure wafer alignment marks, thus limiting the use of stepper based technology. Ge is also difficult to see through when using contact lithography. Moreover, many trilayer techniques involve the use of thick planarizing layers as the first layer, which may not be compatible with the solvent systems used with resists such as polymethylglutarimide (PMGI).

STATEMENT OF THE INVENTION

We have developed a three layer lift-of process that produces outstanding edge definition, and does not suffer from the problems outlined above. The three layers are two resist layers separated by a transfer layer with the approximate composition $SiO_2$.

DETAILED DESCRIPTION

The lithographic lift-off technique of the invention will be described in the context of a process for the fabrication of III–V DHBT devices. However, it will to be appreciated by those skilled in the art that the lift-off technique has broad application to semiconductor device fabrication, and especially to III–V multilayer heterostructure devices with severe topological features, e.g. mesa structures.

Figure 1:
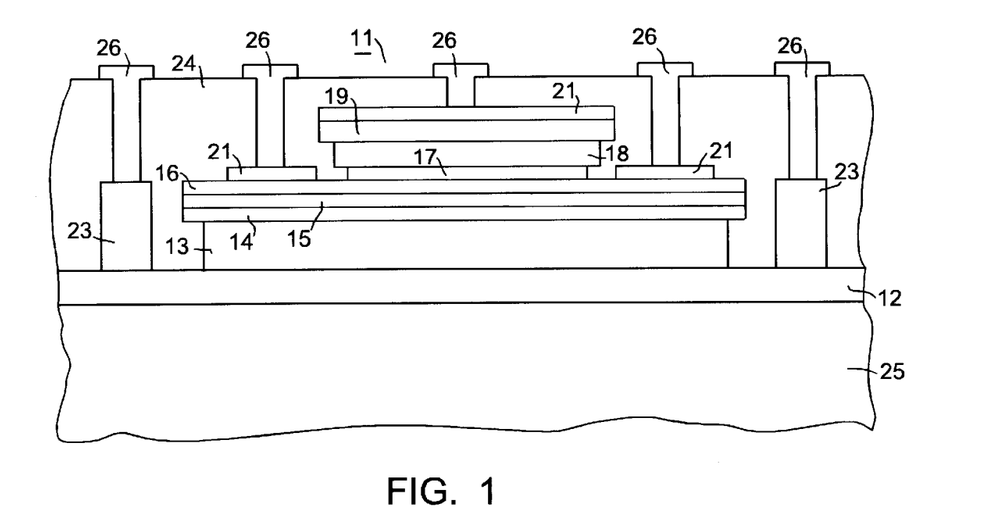
FIG. 1 is a schematic diagram of a Double Heterostructure Bipolar Transistor (DHBT) device fabricated using the technique of the invention.

Referring to FIG. 1, a completed DHBT device 11 of the kind for which the process of the invention is particularly intended is shown. The device has a multilayer semiconductor heterostructure stack which is shown here with seven semiconductor layers 12–18. The multilayer stack may be grown by Metal-Organic Molecular Beam Epitaxy (MO-MBE) using standard growth techniques known in the art. A general description of the MO-MBE process can be found in M. B. Panish and H. Temkin, "Gas Source Molecular Beam Epitaxy", Chapter 4, Springer Series in Materials Science, Vol. 26, Springer-Verlag 1993, which is incorporated herein by reference for details of the process. The MBE growth technique is ideal for making heterostructures because very complex multilayer stacks can be produced in a substrate wafer in a series of sequential growth steps in a vacuum apparatus without breaking the vacuum and handling the wafer. Thus all of the layers in the stack are completed before the device fabrication sequence begins.

Referring to FIG. 1, the substrate layer 25 is semi-insulating InP on which the series of semiconductor layers 12–18 are sequentially grown. Some of these layers comprise a sub-series of graded layers as will be described. However, for clarity and simplicity in the description only the seven functional layers are shown. In the context of processing the multilayer stack, the layers that comprise graded sub-layers are processed as if they were a single layer.

The first grown layer 12 is a 4000 Angstrom $In_{0.53}Ga_{0.47}As$ subcollector layer doped $n^+$ with a dopant concentration of $3\times10^{19}$ $cm^{-3}$. The n-type dopant used in this process was Sn, although other n-type impurities such as Si can be used. The subcollector layer 12 also includes buffer layers to prevent updiffusion of impurities in the multilayer structure. The buffer layers comprise a 200 Å $In_{0.53}Ga_{0.47}As$, n-doped at a level of $1\times10^{18}$ $cm^{-3}$, and a 20 Å undoped $In_{0.53}Ga_{0.47}As$ layer. The collector layer 13 is a 5000 Å layer of n-InP doped to a concentration of $3\times10^{16}$ $cm^{-3}$.

In the heterostructure transistor described here, both the emitter-base and collector-base regions are graded using graded quaternary InGaAsP layers. The graded quaternary layers separating the collector and base is shown at 14, and comprise a 130 Å InGaAsP (1.13 eV) layer, and a 130 Å InGaAsP (0.95 eV) layer. The quaternary layers had a doping level of $1\times10^{17}$ $cm^{-3}$. Buffer layers comprising a 300 Å $In_{0.53}Ga_{0.47}As$ layer n-doped to $1\times10^{17}$ $cm^{-3}$, and a 200 Å undoped $In_{0.53}Ga_{0.47}As$ layer, separate the graded layer 14 from the base layer 15. The base layer 15 is 900 Å of $In_{0.53}Ga_{0.47}As$ doped to a concentration of $3\times10^{19} cm^{-3}$ with carbon. The emitter side of the base also has a quaternary graded layer 16, made Up of a 70 Å of InGaAsP (0.95 eV) layer, and a 70 Å InGaAsP (1.13 eV) layer. The emitter layer 17 is 500 Å of InP n-doped to a concentration of $5\times10^{17}$ $cm^{-3}$. The top semiconductor layer 18 is a contact layer consisting of 2500 Å of $In_{0.53}Ga_{0.47}As$ doped n-type with a concentration of $3\times10 cm^{-3}$.

A metal contact 19 is selectively applied to the top semiconductor contact layer 18 by a lift-off technique. The metal contact 19 is 100 Å Pd+200 Å Pt+1000 Å Au, and during fabrication serves as an etch mask in a self-aligning mode. The lateral dimensions of the metal layer are approximately $3\times5$ $\mu m$. The top semiconductor contact layer 18 is etched using the metal contact layer 19 as an etch mask. A wet etchant is used. An overetch is performed to obtain an undercut of 5000 Å under the metal contact, leaving an area of approximately $2\times4$ $\mu m$ in InGaAs contact layer 18. This patterned contact 18 then serves as the etch mask for the emitter layer 17. The InP emitter layer is then wet etched. The base contact 21 is applied by evaporating 100 Å Pd+200 Å Pt+800 Å Au using the metal contact 19 as a shadow mask to define the inner edge of the base contact. The metal base contact layer also deposits on the metal emitter contact 19 as shown. Metallization for layer 21 is deposited using a lift-off process, which defines the outer edges of the base contacts.

The structure is then encapsulated and the encapsulant patterned to define the base-collector mesa. The encapsulant is applied by spinning Accuglass™ 211 at 2000 RPM onto the surface to produce a 0.26 $\mu m$ layer of polymer encapsulant, and curing the polymer by heating to 300° C. for 10 min. During curing of the spin-on polymer the metal base contact is annealed sufficiently to make ohmic contact through the thin quaternary graded layer 16 to the base layer 15.

The exposed portions of the graded quaternary layer 16 for the emitter-base region, the base layer 15, the graded quaternary layer 14 for the base-collector region, and approximately half the thickness of the collector layer 13, are all sequentially ECR plasma etched using $BCl_3/N_2$. The remaining thickness of collector layer 13 is selectively wet etched, and overetched to produce a substantial, e.g. 2 $\mu m$, undercut as shown in FIG. 1. This undercut serves to reduce the collector-base capacitance of the device.

The use of both wet and dry etching in the process allows the advantages of both techniques to be realized. Plasma etching is convenient, and wet etching is rapid and more selective. Moreover, using a wet etch following a plasma etch tends to remove surface damage caused by plasma exposure. The plasma etch steps in this work used ECR plasma processing in a Plasma-Therm SLR 770 system. Etching is performed at room temperature, at a bias of −80V d.c., a $\mu$-wave power of 250 W, and a pressure of 2 mTorr. Flow rates in sccm are 12 $BCl_3$+3 $N_2$. Plasma etch rates are about 150 Å/min for this etch chemistry. Selective wet etching is performed at 4° C. with 1:1:15 $H_3PO_4$:$H_2O_2$:$H_2O$, for InGaAs and 1:1:1 HCl:$H_3PO_4$:$H_2O$, for InP. Etch rates are 1000 Å/min and 800 Å/min, respectively.

The collector contact layer 12 is then patterned leaving an edge portion thereof accessible for the deposition of collector contacts 23 as shown in FIG. 1. The collector contact is 100 Å Pd+200 Å Pt+7000 Å Au. The finished mesa structure is then passivated and encapsulated with a common layer 24, i.e. a polymer encapsulant. Due to the thickness required to cover the mesa and the emitter and base contacts, i.e 1 $\mu m$, the encapsulant may be applied in two steps.

The device structure is completed by plasma etching via holes through encapsulant layer 24 to the collector, base and emitter metallization respectively, and evaporating metal contacts 26 into the via holes as shown.

Figure 2:
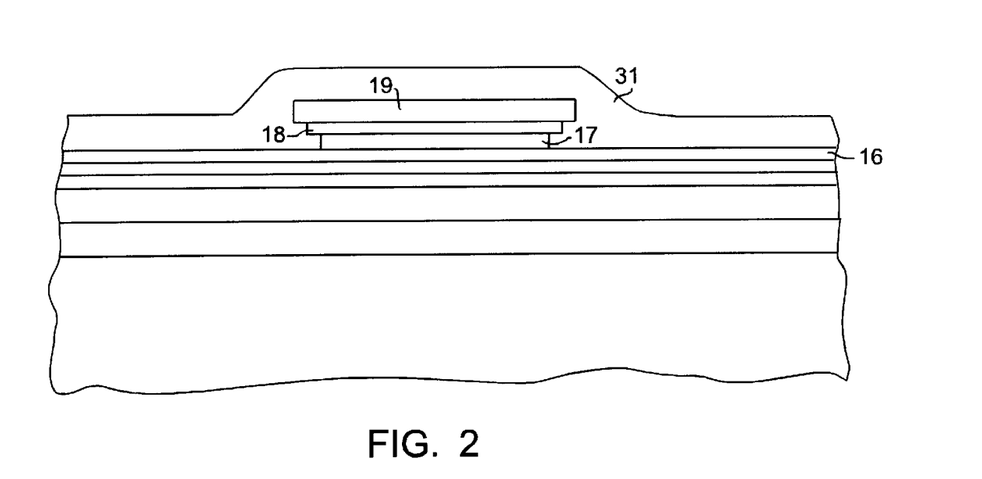
FIGS. 2,3,4,5,6,7,8 and 9 are schematic views representing steps in the lift-off process of the invention as applied to the device of FIG. 1.

The above described process typically uses three lift-off metallization steps, one to define the emitter contact, another to form the base contacts, and a third to form the collector contacts. For the purpose of this description, just one of these steps—deposition and patterning of the metallization for the base contacts—will be illustrated. The point in the fabrication sequence where this metallization step occurs is after patterning of the emitter layer 17, which exposes the emitter/base buffer layer 16 as shown in FIG. 2. At this point the three level resist of the invention is applied. FIG. 2 shows the first level 31 of the three levels, which is blanket deposited over the emitter mesa and the exposed buffer layer. Level 31 is a layer of standard photoresist such as AZ5209 or AZ4210. The developer used with this resist is also standard, e.g. AZ developer. The resist is spun on in the conventional manner and oven baked at 90°C. for 30 minutes.

The thickness of the first level will vary depending on the metallization step. For example, in the first lift-off step, used to define the emitter contact, the first level may be relatively thin, since the metal layer thickness is typically lo substantially less than 1 $\mu m$ and there is essentially no topography at this stage in the process. Later metallization layers are applied over substantial topography, and the metallization itself is typically thicker, i.e. of the order of 1 $\mu m$. Accordingly, for the lift-off step illustrated in the figures, the first level 31 is typically 2–5 $\mu m$.

Figure 3:
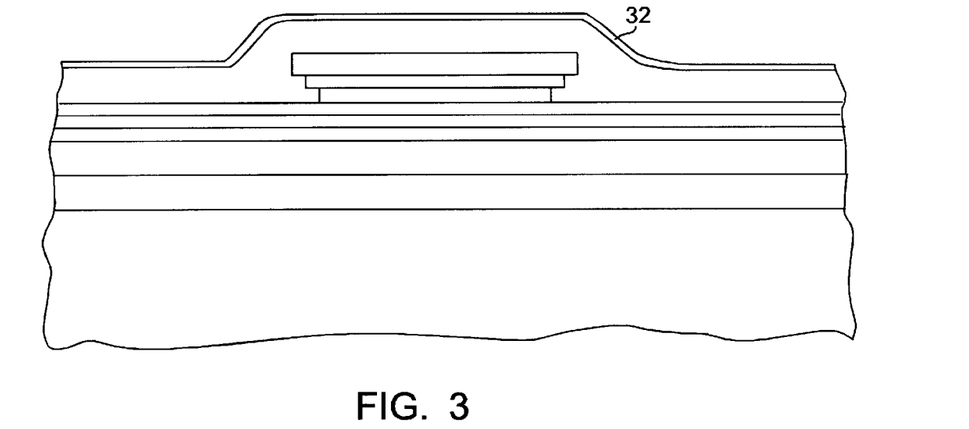

The second or intermediate level 32 of the trilevel resist is $SiO_2$ with a thickness substantially less than the thickness of the first level 31, i.e. within the range 700–1300 Å. The $SiO_2$ layer, shown at 32 in FIG. 3, is evaporated using conventional techniques. The films evaluated in the work described here were evaporated using an Airco-Temescal e-beam evaporator at a gun bias of 10 KeV, a base pressure of $1\times10^{-7}$ Torr, and a deposition rate of 2 to 6 Å/s. The film compositions were determined by Auger spectroscopy in a Perkin Elmer PHI610 Scanning Auger Microprobe at a bias of 5 KeV. Thickness measurements were performed by stylus profilometry using a DEKTAK 3030ST.

Figure 4:
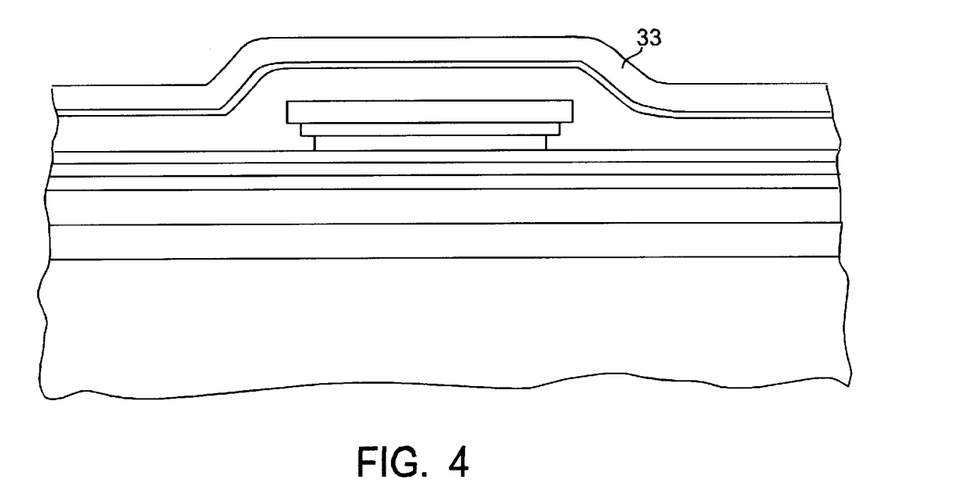

After deposition of the $SiO_2$ intermediate layer, the third level 33 of the trilevel resist is deposited as shown in FIG. 4. The thickness of the third level is sufficient to etch the desired pattern in the second level 32, i.e. typically 0.5–3 μm, and preferably 0.7–1.5 μm.

Figure 5:
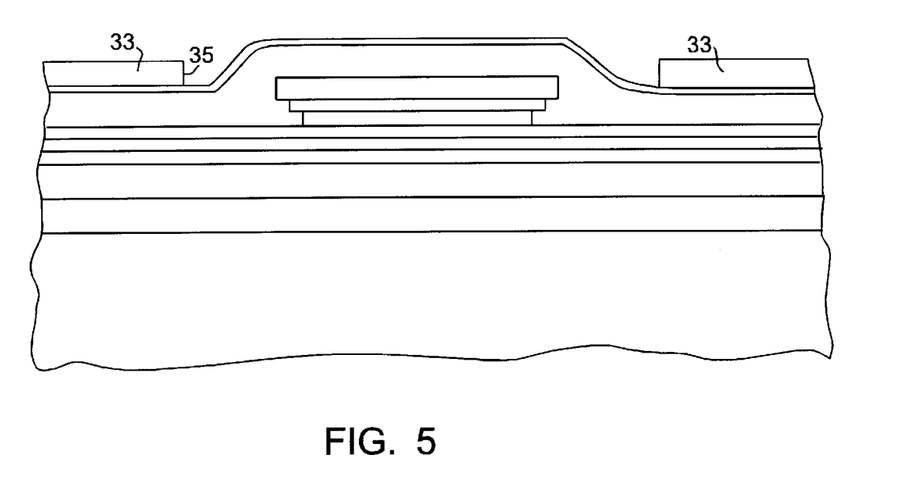
Figure 6:
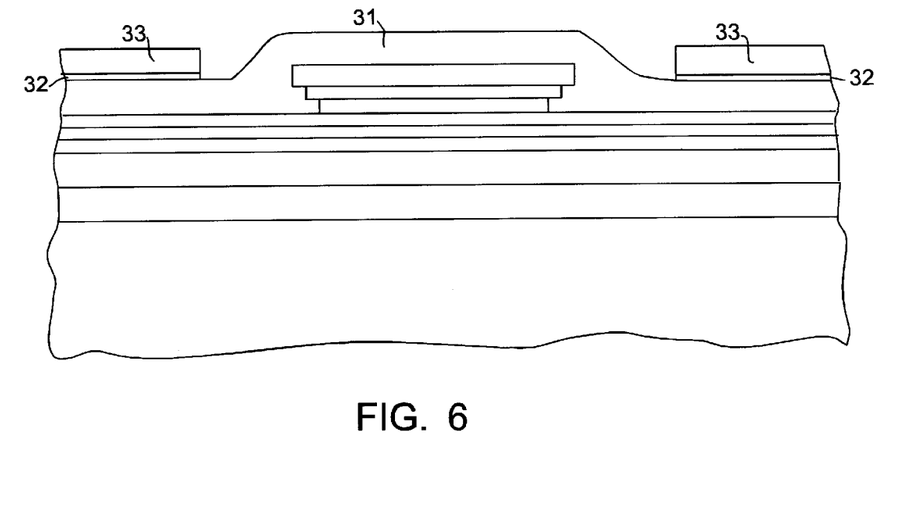

The upper resist level 33 is then exposed, and developed, forming the desired pattern with the outer edges of the base contacts as indicated at 35 in FIG. 5. The patterned layer is oven baked 30 min at 90°C. Using the patterned resist 33 as a mask, the $SiO_2$ layer 32 is plasma etched at room temperature in a Micro-RIE parallel plate etching system to produce the structure shown in FIG. 6 with the lithographic pattern in the upper resist layer transferred to the intermediate $SiO_2$ layer.

Figure 7:
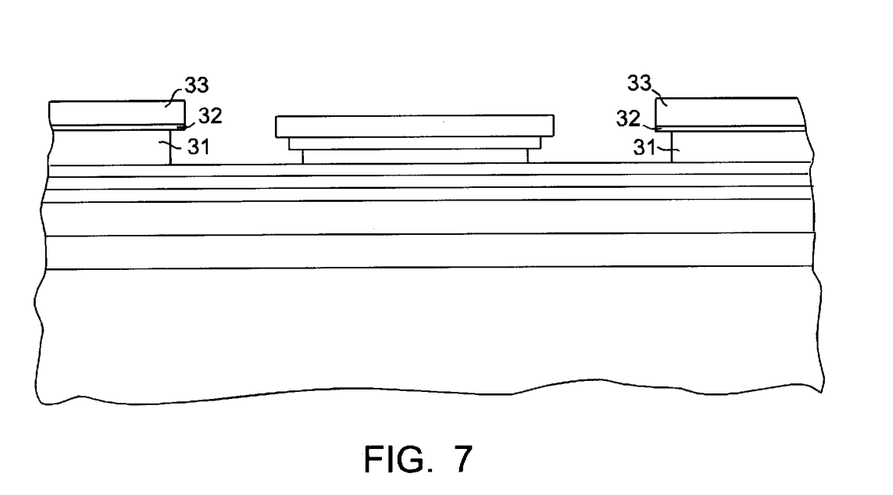

The plasma etching procedures described here are well known in the art and a variety of process parameters can be used to obtain the desired results. For example, for the $SiO_2$ layer etch a $CF_4/O_2$ plasma at 50 W and 250 mTorr can be used. A 50% overetch after end point is used to ensure clearing. Portions of the resist layer 31 exposed after etching the $SiO_2$ layer 32 are removed as shown in FIG. 7 by flood exposure, and then plasma etching with an $O_2$ plasma. The $O_2$ plasma etch is standard, e.g. 50 W and 250 mTorr, and a resist removal rate of ~1000 Å/min. A subsequent undercut of the lower resist level of 0.5 μm to 1 μm is obtained by a wet etch using spray developer. Since the intermediate $SiO_2$ layer is not etched in the $O_2$ plasma or the resist developers used to pattern layer 31, and to undercut layer 33, precise feature definition is retained.

Figure 8:
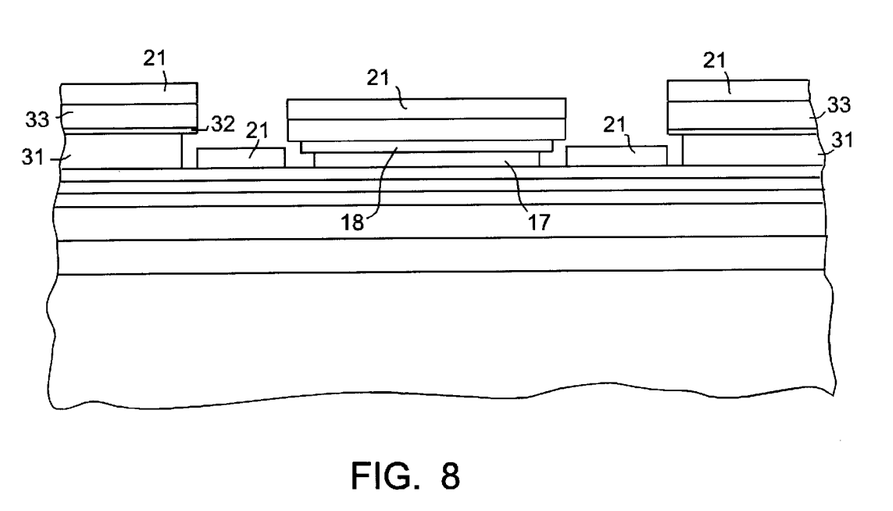

After patterning of the trilevel resist layer, metallization layer is blanket deposited over the resist pattern as shown in FIG. 8. The metallization deposits in a discontinuous layer, i.e. portions 21 as shown, due to the substantial vertical steps between the features on the substrate surface. The undercut in emitter layer 17 and emitter contact layer 18 also aids in ensuring that base metal contacts 21 are spaced from the unwanted portions 33 of the lift-off metallization layer.

The lift-off metallization layer may be any suitable conductive material. In the technology described in detail here the base contact is Pd/Pt/Au and the metallization for interconnect levels is Ti/Pt/Au. The thickness of the layer is typically 0.1–1 μm.

Figure 9:
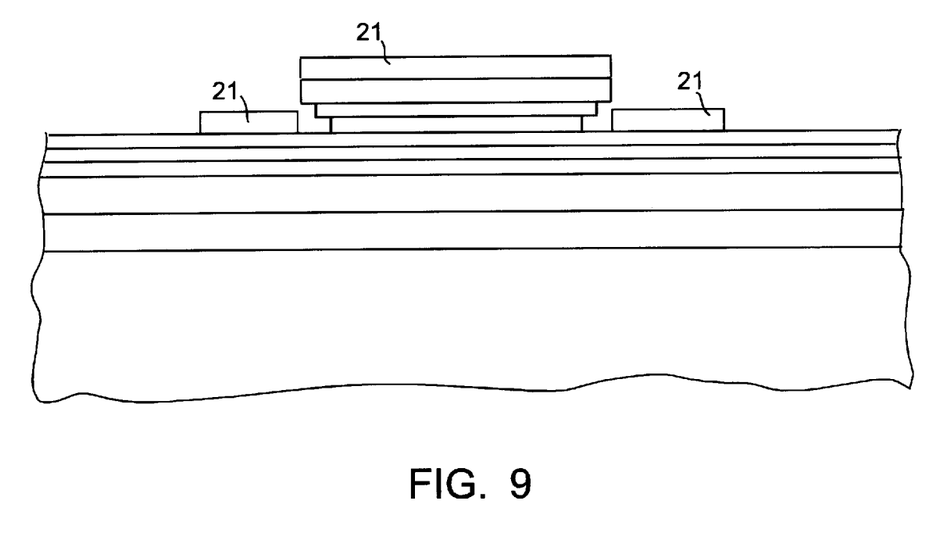

The trilevel resist is then removed with a standard resist solvent such as acetone using a 30 min soak and gentle spray rinse. While the silica intermediate level is not readily soluble in resist solvents, it lifts off on dissolution of the lower and upper polymer resist layers. The unwanted portions 33 of the metallization layer lifts off simultaneously. The structure after lift-off is shown in FIG. 9, which is the intermediate stage of processing the device of FIG. 1 mentioned earlier.

The important feature of the trilevel resist technique of the invention is the intermediate $SiO_2$ layer. Therefore the composition, plasma etching characteristics, and stress levels, of this layer were thoroughly analyzed. Auger analysis was used to determine composition, and stress measurements were performed using a Frontier Semiconductor Measurements Inc., FSM8800.

The compositions of the intermediate layer were nominally $SiO_2$ but were slightly off stoichiometry. The film composition is dependent on the crucible charge. Two silica crucible charges were used for these evaluations, Vycor™ and fused silica. The composition of Vycor by mol % is 32% Si+64% $O_2$+1% Al+3% B. The silica crucible composition was essentially stoichiometric i.e. 33.3% Si, 66.7% O. The compositions in the evaporated films were somewhat oxygen rich. The Vycor charge produced a film composition of 27% Si+70% $O_2$+2% Al+1% B. The silica charge produced films of 31% Si+69% O. However, using this evaporation technique the film compositions from sample to sample or layer to layer were very consistent. It is evident from the stoichiometric variations from source to substrate that oxygen in the source will become depleted after several depositions. Consequently, consistency of the process is improved if the source material is changed frequently, preferably after each deposition.

It was found that even though the two compositions just described are very similar, the Vycor composition is easier to deposit since it out-gases less during initial warm up and during deposition. This allows a lower system pressure during deposition, i.e. $2\times10^{-7}$ Torr for Vycor, compared with $2\times10^{-6}$ Torr for $SiO_2$. Plasma etch rates are similar for both materials, 540 Å/min and 640 Å/min for Vycor and $SiO_2$ respectively.

Stress in the films is determined by comparing the wafer bow, or radius of curvature, before and after $SiO_2$ deposition, using the relationship $$\sigma = Eh^2/(1-v)6Rt$$

where σ is the stress in dynes/cm², E is Young's modulus, h is the substrate thickness, v is Poisson's ratio, t is the film thickness, and R is the radius of curvature of the substrate.

The thickness of the $SiO_2$ film was found to be important to the success of the process. It has to be thick enough to hold the pattern without breaking off when the underlying resist is undercut, and also thin enough to retain dimensional stability. However, if the film is too thick excessive stresses develop and the film will warp or crack during patterning. The threshold stress for the onset of problems with the $SiO_2$ intermediate level is of the order of $1-2\times10^9$ dynes/cm² compressive, which corresponds to an approximate thickness range of 800–1200 Å. The Vycor films have approximately 30% less stress than the nominal silica films for the same thickness. Films thinner than 700 Å tend to crack in the spray development step used to form the undercut. Films thicker than 1300 Å tend to warp during patterning.

To evaluate the merits of the choice of silica deposition techniques, films produced according to the foregoing procedures were compared with films produced by plasma enhanced chemical vapor deposition (PE-CVD). Films with nominal $SiO_2$ composition were PE-CVD deposited at low temperature, i.e. 50° C. These films were deposited at an RF frequency of 13.86 MHz and a power of 60 W, in a chamber at 500 mTorr, using 400 sccm of 2%$SiH_4$ in $N_2$ and 1800 sccm of $N_2O$. Although the PE-CVD $SiO_2$ can be patterned and etched, the lower resist level is hardened by exposure to UV radiation from the plasma. This hardening renders the film essentially insoluble in the spray developer used to produce the undercut.

SEM cross sections used to evaluate the procedures described here showed extremely clean edges on the deposited metal, especially at the outer edges of contacts 21 (FIG. 8). This is attributable in part to the high resolution openings formed during patterning of the trilevel resist due to the $SiO_2$ layer 32. Use of the lift-off technique of the invention results in fewer shorts and other interconnect defects in finished electrical devices, and thus improves yields and lowers device costs.

An advantage of the invention is that the resist materials that comprise two of the three layers of the trilevel resist are standard and are processed using conventional steps and materials. The resist materials can be known photoresists, e-beam resists, x-ray resists, or ion beam resists, depending on the choice of method used to expose the top layer of the trilevel resist. These resist materials are typically polymer materials that can be patterned by crosslinking that is stimulated by least one of the known forms of actinic radiation. For effective lift-off processes they are soluble in a liquid solvent. For the purpose of definition materials that have the foregoing properties are termed "lift-off resists".

It will occur to those skilled in the art that while it is important for the top resist layer to be patterned by a lithographic technique the lithographic properties of the bottom resist layer may be less important. The bottom layer can be patterned by flood exposure using the intermediate layer as a mask and developing as indicated above. Under some circumstances, and with suitable polymer materials, the bottom layer can be patterned by etching directly without actinic exposure. Another alternative is to crosslink the first resist layer by flood exposure before the intermediate layer is deposited. However, the creation of a significant undercut in the bottom resist layer is a useful expedient, and is conveniently achieved using liquid developer. In this case it is desirable to use the preferred sequence as detailed above, i.e. to lithographically pattern the bottom layer, which allows the exposed material to be plasma etched, and the unexposed material to be easily removed by developer to produce the undercut.

As mentioned earlier, the $SiO_2$ layer which forms an important aspect of the trilevel resist technique of the invention is nominally $SiO_2$ but may vary somewhat from the stoichiometric composition. Thus as defined herein materials useful for the intermediate layer comprise silicon oxide with the formula $SiO_x$, where x is in the range 1.8–3.0, and preferably 2.0–2.7. These values define the composition of the deposited film. The source composition may be slightly different.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A process for the manufacture of semiconductor integrated circuit devices which includes at least one step of forming a metallization pattern on a III–V semiconductor substrate the method comprising:
   a. depositing a first resist layer of a polymer resist material on said III–V semiconductor substrate,
   b. depositing by electron beam evaporation an intermediate layer over the first resist layer, said intermediate layer comprising at least $SiO_x$ where x is in the range 1.8–3.0,
   c. depositing a second resist layer of a polymer resist material on said intermediate layer,
   d. lithographically patterning said second resist layer with a metallization pattern,
   e. transferring said metallization pattern to said intermediate layer by etching said intermediate layer using said patterned first resist layer as a mask,
   f. transferring said metallization pattern to said first resist layer by patterning said first resist layer using said intermediate layer as a mask, thereby exposing regions of said III–V semiconductor substrate,
   g. depositing a layer of metallization over said second resist layer with portions of said metallization layer depositing on said exposed regions of said III–V semiconductor substrate and portions of said metallization layer depositing on said second resist layer, and
   h. removing said first and second resist layers, said intermediate layer, and said portions of said metallization layer on said second resist layer by dissolving said first and second resist layers thereby leaving said portions of said metallization layer on said exposed portions of said III–V semiconductor substrate.

2. The process of claim 1 wherein the intermediate layer has a thickness in the range 700–1300Å.

3. The process of claim 1 wherein the second resist layer is a photoresist material.

4. The process of claim 1 wherein said intermediate layer comprises approximately 32 mol % Si+64 mol % $O_2$+1 mol % Al+3 mol % B.

5. The process of claim 1 wherein the step of patterning the first resist layer comprises exposing regions of the first resist layer to actinic radiation using said intermediate layer as a mask, and removing said regions using a plasma etch.

6. The process of claim 5 including the additional step of treating the patterned first resist layer with resist developer to remove portions of said first resist layer under said intermediate layer thereby producing an undercut in said first resist layer.

7. The process of claim 1 in which the said III–V semiconductor substrate comprises a multilayer stack of III–V semiconductor material.

8. The process of claim 7 in which the substrate includes at least one semiconductor mesa.

9. The process of claim 1 in which the intermediate layer is etched using a plasma.

10. The process of claim 9 in which the plasma is a $CF_4/O_2$ plasma.

11. A process for the manufacture of semiconductor integrated circuit devices which includes at least one step of forming a metallization pattern on a III–V semiconductor substrate the method comprising:
   a. depositing a first resist layer of a polymer resist material on said III–V semiconductor substrate,
   b. depositing an intermediate layer over the first resist layer using an evaporation process, said intermediate layer comprising at least 96 mol % $SiO_x$ where x is in the range 1.8–3.0, said intermediate layer additionally having a thickness in the range 700–1300Å,
   c. depositing a second resist layer of a polymer resist material on said intermediate layer,
   d. lithographically patterning said second resist layer with a metallization pattern,
   e. transferring said metallization pattern to said intermediate layer by etching said intermediate layer using said patterned first resist layer as a mask,
   f. transferring said metallization pattern to said first resist layer by patterning said first resist layer using said intermediate layer as a mask, thereby exposing regions of said III–V semiconductor substrate,
   g. treating the patterned first resist layer with a wet etchant to remove portions of said first resist layer under said intermediate layer thereby producing an undercut in said first resist layer,
   h. depositing a layer of metallization over said second resist layer with portions of said metallization layer depositing on said exposed regions of said III–V semiconductor substrate and portions of said metallization layer depositing on said second resist layer, and i. removing said first and second resist layers, said intermediate layer, and said portions of said metallization layer on said second resist layer by dissolving said first and second resist layers thereby leaving said portions of said metallization layer on said exposed portions of said III–V semiconductor substrate.

12. The process of claim 11 in which the said substrate comprises a multilayer stack of III–V semiconductor material.

13. The process of claim 11 wherein the wet etchant is photoresist developer.

* * * * *